United States Patent
Abe et al.

(10) Patent No.: US 12,183,405 B2
(45) Date of Patent: Dec. 31, 2024

(54) SEMICONDUCTOR MEMORY DEVICE AND MEMORY SYSTEM

(71) Applicant: KIOXIA CORPORATION, Tokyo (JP)

(72) Inventors: Mitsuhiro Abe, Kawasaki Kanagawa (JP); Yasuhiro Hirashima, Kawasaki Kanagawa (JP); Mitsuaki Honma, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 197 days.

(21) Appl. No.: 17/899,014

(22) Filed: Aug. 30, 2022

(65) Prior Publication Data

US 2023/0317179 A1 Oct. 5, 2023

(30) Foreign Application Priority Data

Mar. 30, 2022 (JP) .................... 2022-057039

(51) Int. Cl.
*G11C 16/32* (2006.01)
*H01L 25/065* (2023.01)

(52) U.S. Cl.
CPC .......... *G11C 16/32* (2013.01); *H01L 25/0657* (2013.01); *H01L 2225/06506* (2013.01); *H01L 2225/06562* (2013.01)

(58) Field of Classification Search
CPC ..... G11C 16/32; G11C 16/0483; G11C 29/42; H01L 25/0657; H01L 2225/06506; H01L 2225/06562; H01L 2225/0651
See application file for complete search history.

(56) References Cited

U.S. PATENT DOCUMENTS

| | | | |
|---|---|---|---|
| 6,052,314 A * | 4/2000 | Sawase | G11C 16/10 365/189.16 |
| 11,373,710 B1 * | 6/2022 | Hsu | G11C 16/30 |
| 2012/0063234 A1 | 3/2012 | Shiga et al. | |
| 2013/0021853 A1 | 1/2013 | Yoo | |
| 2019/0213121 A1 | 7/2019 | Yamauchi | |
| 2021/0020248 A1 | 1/2021 | Kwon | |

FOREIGN PATENT DOCUMENTS

| | | |
|---|---|---|
| JP | 2012-058860 A | 3/2012 |
| TW | 201314693 A | 4/2013 |
| TW | I677881 B | 11/2019 |

* cited by examiner

*Primary Examiner* — Xiaochun L Chen
(74) *Attorney, Agent, or Firm* — Kim & Stewart LLP

(57) ABSTRACT

A semiconductor memory device includes a first pad, a clock generation circuit configured to generate a first clock, an output circuit configured to output the first clock through the first pad, a designation circuit configured to designate one of a plurality of contiguous times slots, each of which is set with respect to clock cycles of the first clock, and a peak control circuit configured to execute an operation that generates a current peak, at a timing corresponding to the designated time slot.

17 Claims, 14 Drawing Sheets

SEMICONDUCTOR MEMORY DEVICE AND MEMORY SYSTEM

CROSS-REFERENCE TO RELATED APPLICATION(S)

This application is based upon and claims the benefit of priority from Japanese Patent Application No. 2022-057039, filed Mar. 30, 2022, the entire contents of which are incorporated herein by reference.

FIELD

Embodiments described herein relate generally to a semiconductor storage device and a memory system.

BACKGROUND

A NAND type memory has been used as a semiconductor memory device. In this semiconductor memory device, there is a need to reduce a peak current.

DETAILED DESCRIPTION

Embodiments provide a semiconductor memory device and a memory system which are capable of reducing a peak current.

In general, according to one embodiment, a semiconductor memory device includes a first pad, a clock generation circuit configured to generate a first clock, an output circuit configured to output the first clock through the first pad, a designation circuit configured to designate one of a plurality of contiguous times slots, each of which is set with respect to clock cycles of the first clock, and a peak control circuit configured to execute an operation that generates a current peak, at a timing corresponding to the designated time slot.

Hereinafter, embodiments of the present disclosure will be described in detail with reference to the accompanying drawings.

First Embodiment

According to the present embodiment, in a semiconductor memory device having a multi-chip configuration, a specific chip is designated as a leader, and the other chips are designated as followers, such that an operation of each chip may be controlled in a manner where all of the chips use a clock generated by the leader, to enable a peak current control.

(Configuration of Memory System)

Figure 1:
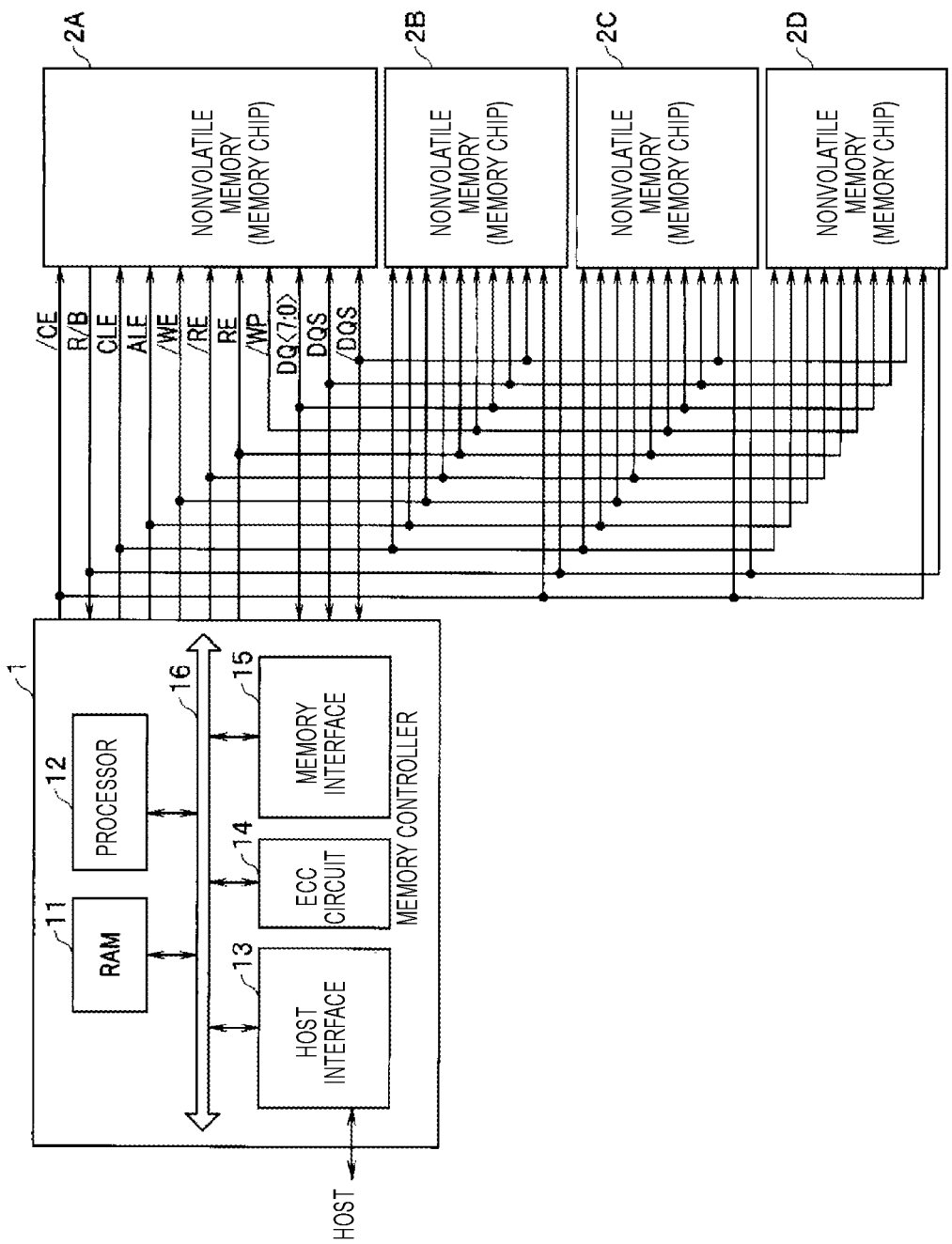
FIG. 1 is a block diagram illustrating an example of a configuration of a memory system according to an embodiment.

FIG. 1 is a block diagram illustrating an example of a configuration of a memory system according to the embodiment. The memory system of the present embodiment includes a memory controller 1 and one or more NAND type nonvolatile memories. FIG. 1 represents an example where four NAND type nonvolatile memories 2A to 2D are provided. Hereafter, when the four NAND type nonvolatile memories 2A to 2D do not need to be distinguished from each other, the memories will be referred to as NAND type nonvolatile memories 2. Further, the NAND type nonvolatile memories may be simply referred to as nonvolatile memories. The memory system may be connected to a host (not illustrated). The host is, for example, an electronic device such as a personal computer, a mobile terminal or the like. Each nonvolatile memory 2 is, for example, a chip. In the descriptions herein below, the nonvolatile memories 2 may also be referred to as memory chips 2. The memory chips 2 may be stacked in the memory device.

Figure 2:
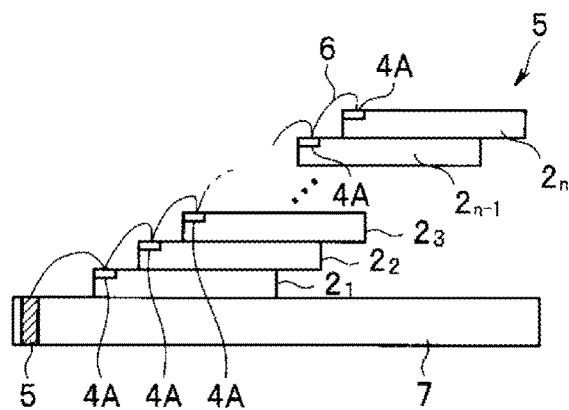
FIG. 2 is a schematic cross-sectional view illustrating an example of a structure of a memory device in which memory chips are stacked.

FIG. 2 is a schematic cross-sectional view illustrating an example of a structure of the memory device in which the memory chips 2 are stacked. FIG. 2 represents an example where an "n" number of memory chips $2_1, 2_2, \ldots, 2n$ are stacked on a wiring substrate 7. When the "n" number of memory chips $2_1, 2_2, \ldots, 2_n$ do not need to be distinguished from each other, the memory chips will be referred to as memory chips 2. The memory device achieves a high memory density and a large storage capacity by using multiple memory chips 2.

The memory chips 2 are stacked on a substrate, in order to reduce the size (area) of the package. The stacked memory chips 2 are connected to each other, using a bonding wire 6, a through via or the like.

For example, as illustrated in FIG. 2, when an upper memory chip $2_n$ and a lower memory chip $2_{n-1}$ are connected to each other by the bonding wire 6, the upper memory chip $2_n$ is stacked on the lower memory chip $2_{n-1}$ while being offset from the lower memory chip $2_{n-1}$ by a predetermined interval. As a result, a pad 4A provided on the lower memory chip $2_{n-1}$ is exposed without being covered by the upper memory chip $2_n$.

For example, the pads 4A of the respective memory chips 2 are connected to the bonding wire 6, to be connected to a terminal 5 of the wiring substrate 7. In this way, the multiple memory chips 2 share the wire for inputting/outputting each signal. Thus, the memory chips 2 do not individually drive the data line of this signal. Accordingly, among the multiple nonvolatile memories (and controllers) that share the data line of this signal, only one chip may output data through this data line.

(Peak Current)

When the multi-chip configuration is adopted as illustrated in FIG. 2, the timings of cell operations of the multiple memory chips 2 may be coincident. In this case, current peaks may be concurrently generated in the respective memory chips 2 as a result of the cell operations thereof, and thus, the total peak current may exceed a designed limit. Thus, a TDPPM (time division peak power management) may be adopted for managing a period in which a current peak may be generated, for each memory chip 2.

In this management method, however, a common clock needs to be provided to all of the memory chips 2, so as to manage the cell operations thereof. In the TDPPM of related art, a common clock is supplied from a controller to all of the memory chips 2. As a result, there is a problem in that terminals or wires for supplying a clock increase, resulting in the increase in the load of the controller.

Thus, it may be considered to adopt a method of managing the peak generation period by using a clock generated in each memory chip 2. However, in this case, it is necessary to synchronize the respective internal clocks with each other every predetermined period, and in an operation performed for a long period, the peak current may not be reliably managed.

(Leader and Followers)

Thus, in the present embodiment, a specific memory chip (hereinafter, also referred to as a leader) among all the memory chips 2 generates a clock, and the clock generated by the leader is supplied to all of the other memory chips (hereinafter, also referred to as followers) through a terminal connected in common to all of the memory chips 2, so that the TDPPM, which stably manages the generation period of the peak current, may be implemented.

In FIG. 1, each nonvolatile memory (memory chip) 2 is a semiconductor memory device that stores data in a nonvolatile manner. As illustrated in FIG. 1, the memory controller 1 and each nonvolatile memory 2 are connected to each other through a NAND bus. The memory controller 1 controls a data write to the nonvolatile memory 2 according to a write request from the host. Further, the memory controller 1 controls a data read from the nonvolatile memory 2 according to a read request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to each other by an internal bus 16.

The host interface 13 outputs a request received from the host, along with write data which are user data, and others, to the internal bus 16. Further, the host interface 13 transmits user data read from the nonvolatile memory 2, a response from the processor 12, and others, to the host.

The memory interface 15 controls a process of writing user data and others to the nonvolatile memory 2 and a process of reading user data and others from the nonvolatile memory 2 based on an instruction from the processor 12.

The processor 12 controls the memory controller 1. The processor 12 is, for example, a CPU (central processing unit), an MPU (micro processing unit) or the like. When a request is received from the host through the host interface 13, the processor 12 performs control of the memory controller 1 according to the request. For example, the processor 12 instructs the memory interface 15 to write user data and parity to the nonvolatile memory 2 according to the request from the host. Further, the processor 12 instructs the memory interface 15 to read user data and parity from the nonvolatile memory 2 according to the request from the host.

The processor 12 determines a storage area (hereinafter, referred to as a memory area) in the nonvolatile memory 2, for user data accumulated in the RAM 11. The user data are stored in the RAM 11 via the internal bus 16. The processor 12 determines the memory area for the user data in units of a page which is a write unit (each such unit of user data referred to herein as "page data"). In the descriptions herein, the user data stored in one page of the nonvolatile memory 2 are defined as unit data. The unit data are, for example, encoded, and stored as a codeword in the nonvolatile memory 2.

The encoding may be an optional feature and may not be performed in the memory controller 1. While the memory controller 1 may store the unit data in the nonvolatile memory 2 without encoding the unit data, FIG. 1 represents an example of a configuration where the encoding is performed. When the memory controller 1 does not perform the encoding, the page data match the unit data. Further, one codeword may be generated based on one unit data, or one codeword may be generated based on divided data obtained by dividing the unit data. Further, one codeword may be generated using multiple unit data.

The processor 12 determines the memory area of the nonvolatile memory 2 which is a write destination, for each unit data. A physical address is allocated to the memory area of the nonvolatile memory 2. The processor 12 manages the memory area, which is the write destination of the unit data, by using the physical address. The processor 12 instructs the memory interface 15 to write the user data to the nonvolatile memory 2 by designating a physical address of a determined memory area. The processor 12 manages the correspondence between a logical address of the user data (which is a logical address managed by the host) and a physical address. When a read request including a logical address is received from the host, the processor 12 determines a physical address that corresponds to the logical address, and instructs the memory interface 15 to read the user data by designating the physical address.

The ECC circuit 14 encodes the user data stored in the RAM 11, and generates a codeword. Further, the ECC circuit 14 decodes a codeword read from the nonvolatile memory 2.

The RAM 11 temporarily stores user data received from the host until the user data are stored in the nonvolatile memory 2, or temporarily stores data read from the nonvolatile memory 2 until the data are transmitted to the host. The RAM 11 is, for example, a general-purpose memory such as an SRAM (static random access memory), a DRAM (dynamic random access memory) or the like.

FIG. 1 illustrates an example of a configuration where the memory controller 1 includes each of the ECC circuit 14 and the memory interface 15. However, the ECC circuit 14 may be built in the memory interface 15. Further, the ECC circuit 14 may be built in the nonvolatile memory 2.

When a write request is received from the host, the memory controller 1 operates as follows. The processor 12 temporarily stores write data in the RAM 11. The processor 12 reads the data stored in the RAM 11, and sends the read data to the ECC circuit 14. The ECC circuit 14 encodes the input data, and sends the obtained codeword to the memory interface 15. The memory interface 15 writes the input codeword in the nonvolatile memory 2.

When a read request is received from the host, the memory controller 1 operates as follows. The memory interface 15 sends a codeword read from the nonvolatile memory 2 to the ECC circuit 14. The ECC circuit 14 decodes the input codeword, and stores the decoded data in the RAM 11. The processor 12 transmits the data stored in the RAM 11 to the host via the host interface 13.

The processor 12 of the memory controller 1 controls the memory interface 15, and transmits a signal DQ<7:0> and data strobe signals DQS and /DQS to the nonvolatile memory 2. The signal DQ<7:0> transmitted from the memory controller 1 to the nonvolatile memory 2 includes a command, an address, or data. The transmitted data may include "SetFeature" data, which are setting values of various operation modes of the nonvolatile memory 2, and write data to be written to a memory cell array 23 to be described later. The data strobe signals DQS and /DQS are synchronous control signals which are generated in synchronization with data transmission and indicate read and write timings.

The processor 12 controls the memory interface 15, to transmit a chip enable signal /CE, a signal CLE, a signal ALE, a signal /WE, and read enable signals RE and /RE to the nonvolatile memory 2. The signal /CE is a signal for bringing each nonvolatile memory 2 into an operational state. The write enable signal /WE is a signal indicating a write into the nonvolatile memory 2, and the nonvolatile memory 2 performs input processing of a command or an address when receiving the signal /WE. That is, the signal /WE may be referred to as an input signal. The command latch enable signal CLE is a signal for instructing the latch of a command, and the address latch enable signal ALE is a signal for instructing the latch of an address.

A signal with a symbol "/" in front thereof indicates an active•low logic or non-logic. That is, a signal having no symbol "/" in front thereof becomes active at a high "H" level, and a signal having the symbol "/" in front thereof becomes active at a low "L" level.

The nonvolatile memory 2 receives various signals from the memory controller 1, and transmits the signal DQ<7:0> and the data strobe signals DQS and /DQS to the memory controller 1, by an input/output circuit 22 to be described later. Further, the nonvolatile memory 2 transmits a signal R/B to the memory controller 1. The signal R/B indicates whether the nonvolatile memory 2 is in a ready state where the nonvolatile memory 2 is able to receive a command from the outside, or a busy state where the nonvolatile memory 2 is unable to receive a command from the outside.

Further, the memory controller 1 may output a write protect signal /WP. The respective memory chips 2 are connected in common to a terminal (pad) /WP used for transmitting the write protect signal /WP. However, in the present embodiment, the write protect signal /WP is not used for transmitting the write protect signal /WP.

The four memory chips 2 may be packaged. In the example of FIG. 1, one memory controller 1 controls the four memory chips 2 provided in one package. Further, one memory controller 1 may control the memory chips 2 provided in a plurality of packages.

Figure 3:
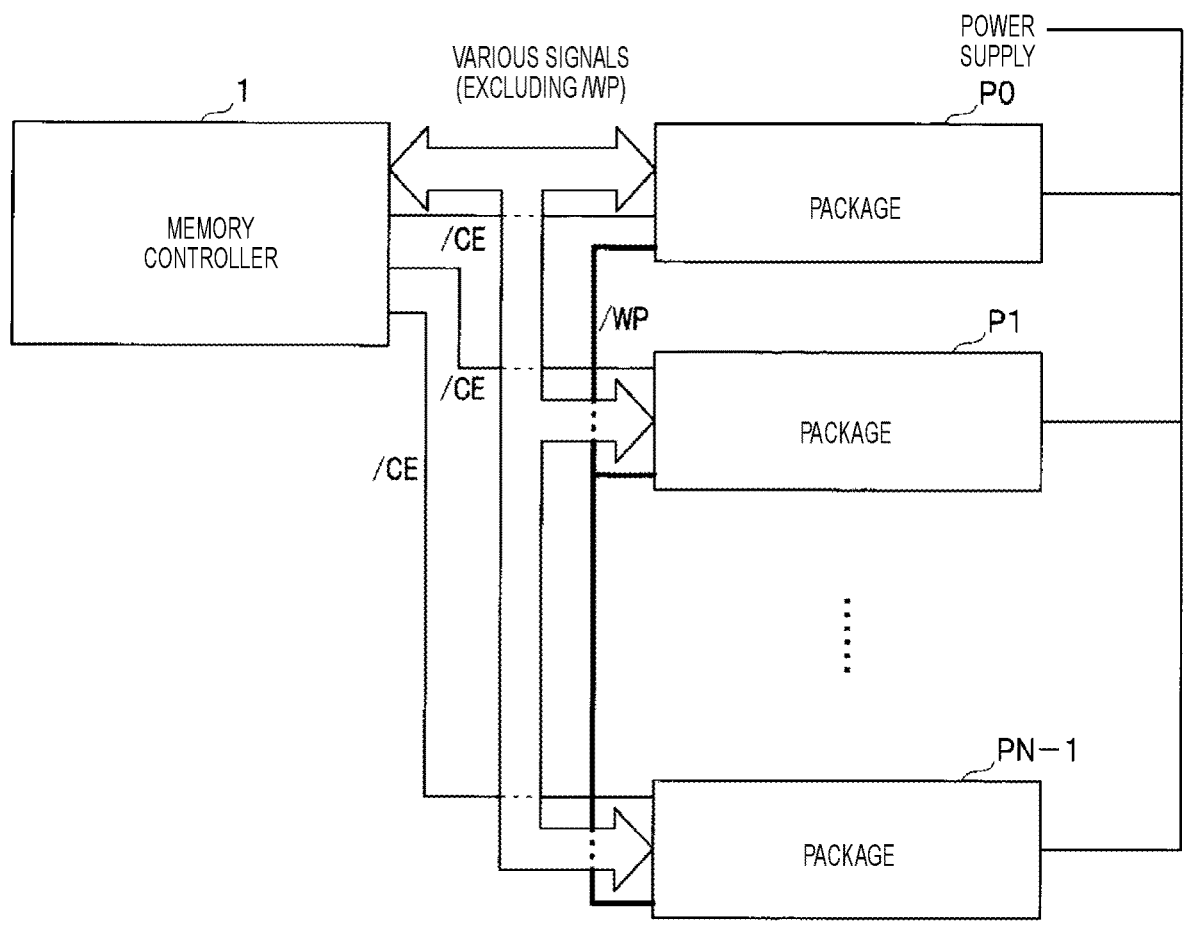
FIG. 3 is a block diagram illustrating an example of a configuration of a memory system with a plurality of packages.
Figure 4:
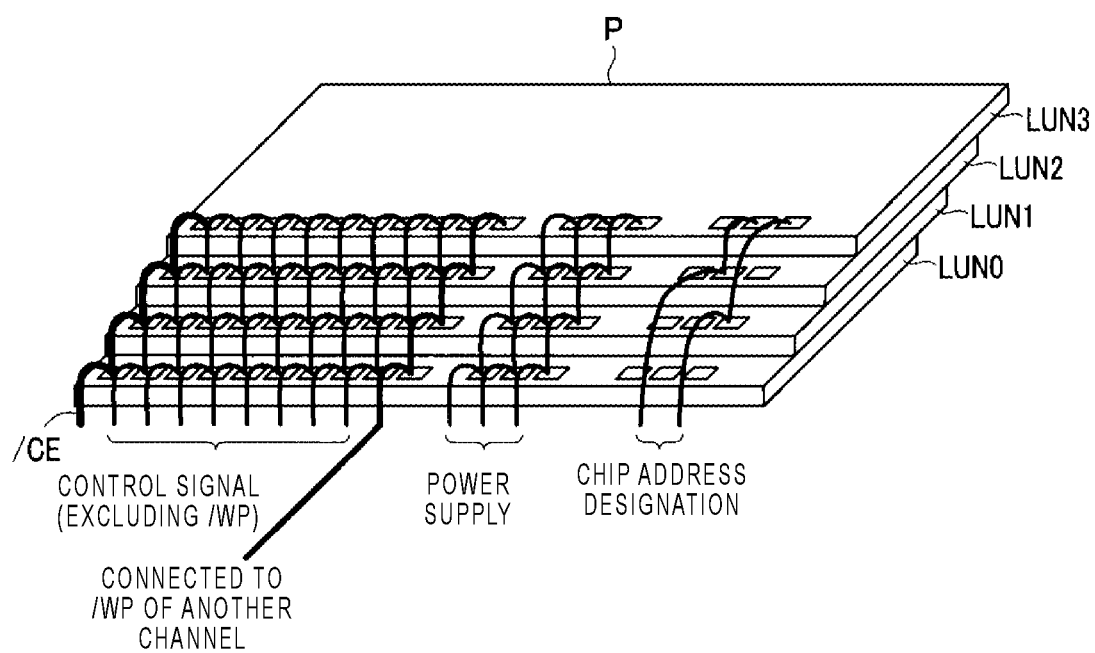
FIG. 4 is a view illustrating an example of a configuration of one package.

FIG. 3 is a block diagram illustrating the example described above. FIG. 4 is a view illustrating an example of a configuration of one package.

As illustrated in FIG. 3, the memory controller 1 and respective packages P0 to PN−1 (hereinafter, referred to as packages P when the packages do not need to be distinguished from each other) are connected to each other by a NAND bus, such that the respective signals except for the write protect signal /WP are transmitted between the memory controller 1 and the respective memory chips 2 in the packages P. Further, a wire is provided between the memory controller 1 and each package P, to individually supply the chip enable signal /CE. A power supply voltage is supplied to each package P from a predetermined power supply.

In the present embodiment, the terminal /WP for receiving the write protect signal /WP is used to connect the memory chips 2 in each package P to each other, as described above.

As illustrated in FIG. 4, each package P includes a plurality of memory chips 2 (depicted as LUN0-LUN3). In addition, while FIG. 4 represents an example where each package P is configured with four memory chips 2, the number of memory chips 2 of the package P is not limited. As illustrated in FIG. 4, the respective memory chips 2 in the package P share various wires for supplying the various signals, except for the write protect signal /WP, and a power supply. That is, in the package P, a group to which the signal lines shared by the signals ALE, CLE, DQ, DQS, /DQS, /WE, /RE, RE and others are supplied may be referred to as a channel. That is, in the example of FIG. 4, a channel is configured with one package P. In the example of FIG. 4, only one chip enable signal /CE is supplied in the package P. However, one package P may have a group driven by a plurality of chip enable signals /CE.

A chip address is used for selecting each memory chip 2 of the group driven by one chip enable signal /CE. In the example of FIG. 4, since four memory chips 2 are selected by the chip enable signal /CE, the memory chips 2 may be specified by a 2-bit chip address. In addition, each memory chip 2 specified by the chip address will be referred to as LUN. FIG. 4 represents an example where four LUNs including LUN0 to LUN3 exist in one package P.

(Configuration of Nonvolatile Memory)

Figure 5:
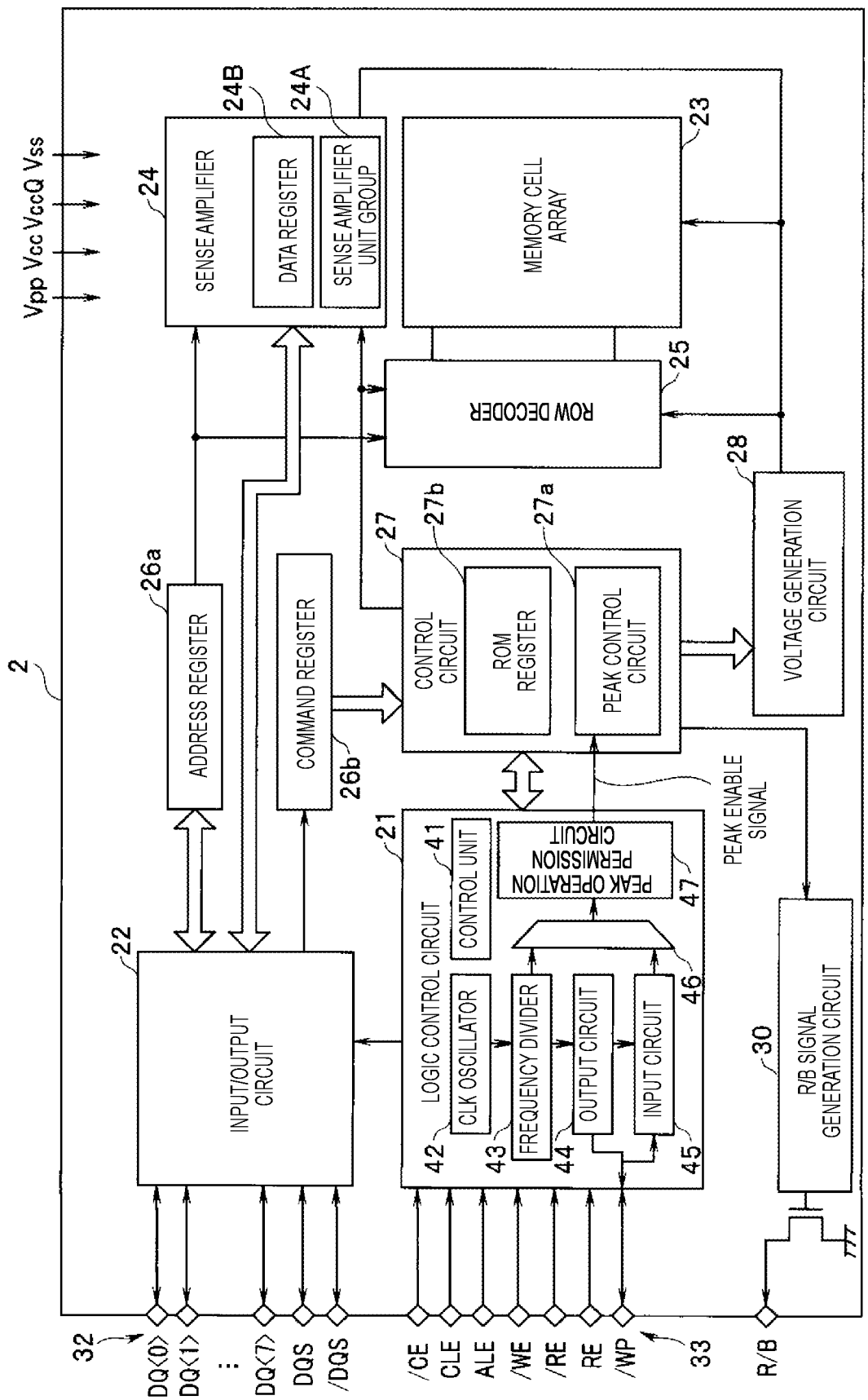
FIG. 5 is a block diagram illustrating an example of a configuration of a nonvolatile memory of the present embodiment.

FIG. 5 is a block diagram illustrating an example of the configuration of the nonvolatile memory of the present embodiment. The nonvolatile memory (memory chip) 2 includes a logic control circuit 21, an input/output circuit 22, a memory cell array 23, a sense amplifier 24, a row decoder 25, an address register 26a, a command register 26b, a control circuit 27, a voltage generation circuit 28, an R/B signal generation circuit 30, an input/output pad group 32, and a logic control pad group 33.

The memory cell array 23 includes a plurality of blocks (memory blocks). Each of the plurality of blocks BLK includes a plurality of memory cell transistors (memory cells). In the memory cell array 23, a plurality of bit lines, a plurality of word lines, a source line and others are provided for controlling voltages applied to the memory cell transistors.

Since the input/output pad group 32 performs the transmission/reception of each signal including data with respect to the memory controller 1, the input/output pad group 32 is provided with a plurality of terminals (pads) that corresponds to the signal DQ<7:0> and the data strobe signals DQS and /DQS.

Since the logic control pad group 33 performs the transmission/reception of each signal with respect to the memory controller 1, the logic control pad group 33 is provided with a plurality of terminals (pads) that corresponds to the chip enable signal /CE, the command latch enable signal CLE, the address latch enable signal ALE, the write enable signal /WE, and the read enable signals RE and /RE.

In the present embodiment, the terminal (pad) /WP corresponding to the write protect signal /WP is used for transmitting a clock CK between the leader and the followers.

The logic control circuit 21 and the input/output circuit $2_2$ are connected to the memory controller 1 via a NAND bus. The logic control circuit 21 receives an external control signal (e.g., the chip enable signal /CE, the command latch enable signal CLE, the address latch enable signal ALE, the write enable signal /WE, and the read enable signals RE and /RE) via the NAND bus. Further, the R/B signal generation circuit 30 transmits the signal R/B to the memory controller 1 via the NAND bus.

The address register 26a stores addresses. The command register 26b stores commands. The address registers 26a and 26b are each configured with, for example, an SRAM.

Various operation powers, such as power supply voltages Vcc, VccQ, and Vpp and a ground voltage Vss, are supplied to the nonvolatile memory 2. In addition, the power supply voltage Vcc is a circuit power supply voltage which is generally supplied from the outside as an operation power, and is, for example, a voltage of about 2.5 V. The power supply voltage VccQ is, for example, a voltage of 1.2 V. The power supply voltage VccQ is used when a signal is transmitted/received between the memory controller 1 and the nonvolatile memory 2. The power supply voltage Vpp is a voltage higher than the power supply voltage Vcc, and is, for example, a voltage of 12 V.

The control circuit 27 receives a command from the command register 26b, and controls each part of the nonvolatile memory 2 according to a sequence based on the command.

The voltage generation circuit 28 is controlled by the control circuit 27, to receive a power supply voltage from the outside of the nonvolatile memory 2, and generate a plurality of voltages required for a write operation, a read operation, and an erase operation by using the power supply voltage. The voltage generation circuit 28 supplies the generated voltage to the memory cell array 23, the sense amplifier 24, the row decoder 25 and others.

The row decoder 25 receives a row address from the address register 26a, and decodes the row address. The row decoder 25 executes an operation of selecting a word line based on the decoded row address. Then, the row decoder 25 transfers a plurality of voltages required for the write operation, the read operation, and the erase operation to a selected block.

A sense amplifier unit group 24A of the sense amplifier 24 receives a column address from the address register 26a, and decodes the column address. The sense amplifier unit group 24A selects a bit line based on the decoded column address. Further, during a data read, the sense amplifier unit group 24A detects and amplifies data read from a memory cell transistor into the bit line. Further, during a data write, the sense amplifier unit group 24A transfers write data to the bit line.

The sense amplifier 24 includes a data register 24B, and during a data read, the data register 24B stores data detected by the sense amplifier unit group 24A, and serially transfers the stored data to the input/output circuit 22. Further, during a data write, the data register 24B stores data serially transferred from the input/output circuit 22, and transfers the stored data to the sense amplifier unit group 24A. The data register 24B is configured with an SRAM or the like.

The input/output circuit $2_2$ is controlled by the logic control circuit 21, and transmits/receives the signals DQ (e.g., DQ0 to DQ7), DQS, and /DQS with respect to the memory controller 1 via the NAND bus.

Figure 6:
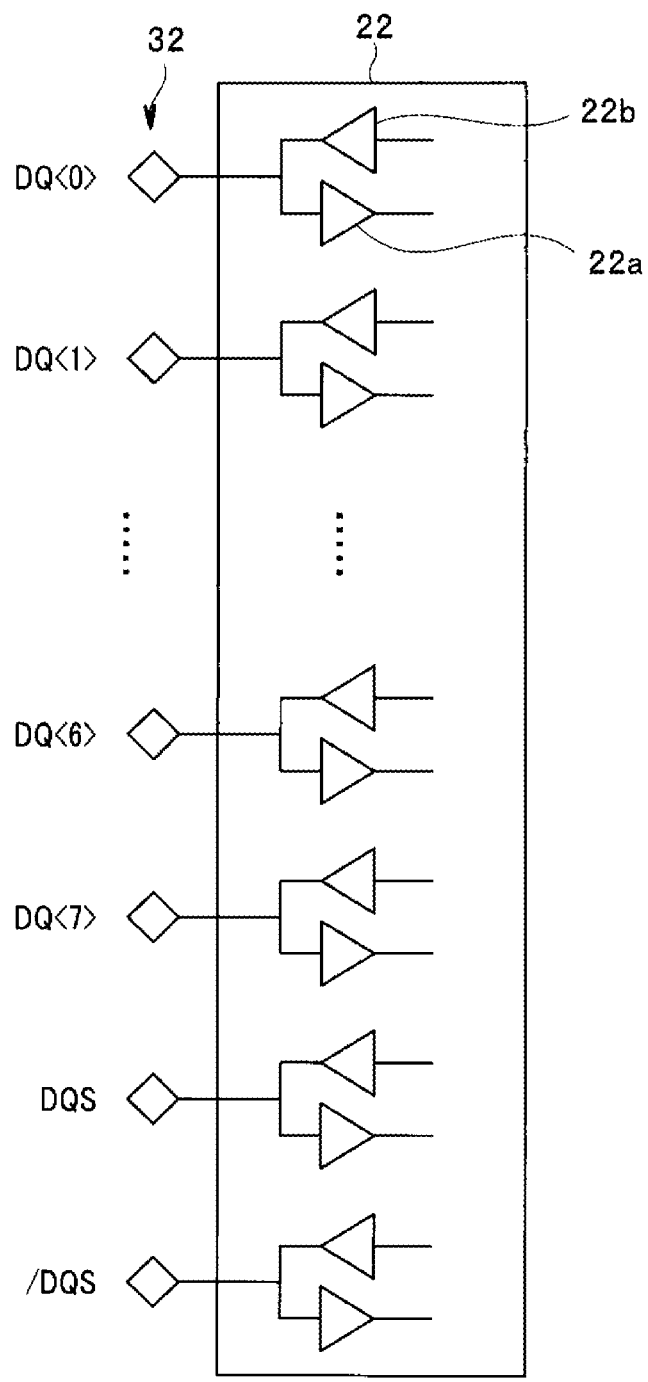
FIG. 6 is a circuit diagram illustrating a part of a configuration of an input/output circuit.

FIG. 6 is a circuit diagram illustrating a part of a configuration of the input/output circuit 22. As illustrated in FIG. 6, the input/output circuit 22 includes an input receiver 22a and an output driver 22b for each terminal of the input/output pad group 32. The input receiver 22a receives a signal input via each terminal, and the output driver 22b transmits a signal to be output via each terminal.

When the signal DQ is received together with the signals DQS and /DQS, the input/output circuit 22 receives the signal DQ as data in synchronization with the signals DQS and /DQS. Further, in response to a signal RE which may be given to the logic control circuit 21, the input/output circuit 22 transmits data read from the memory cell array 23 as the signal DQ to the memory controller 1 together with the signals DQS and /DQS.

The input/output circuit 22 is controlled by the logic control circuit 21, to enable a signal transfer in response to the signal /WE or a signal transfer in response to the signals DQS and /DQS. The input/output circuit 22 is controlled by the logic control circuit 21, to output various received signals to the address register 26a or the command register 26b.

The logic control circuit 21 determines whether the signal transfer to/from the own nonvolatile memory 2 is designated by the memory controller 1, using an address Cadd. The logic control circuit 21 controls the input/output circuit $2_2$ in response to the signal CLE, to enable a command received as the signal DQ to be output to the command register 26b. The logic control circuit 21 controls the input/output circuit $2_2$ in response to the signal ALE, to enable an address received as the signal DQ to be output to the address register 26a. In synchronization with the signal /WE, the logic control circuit 21 enables a signal received in the input/output circuit $2_2$ to be output and written to each unit.

When a command is received from the command register 26b, the control circuit 27 analyzes the command, and controls the logic control circuit 21 based on the analysis result.

(Control of Peak Operation)

In the present embodiment, when a peak control start command is input, the control circuit 27 executes a peak management by the TDPPM.

In the memory cell array 23, an area is set which stores system information for setting the operation of the system (hereinafter, referred to as an ROM area). In the present embodiment, peak management information for the TDPPM is also stored in the ROM area. In the TDPPM, slots are set which are time slots that synchronize with the clock CK (hereinafter, simply referred to as slots), and represent the circulation of a number that designates a slot (hereinafter, referred to as a slot number) in a cycle of a predetermined number of slots (hereinafter, referred to as the total number of slots). The management of the peak current (referred to as peak operation control) is performed by specifying a slot in which the peak current may be generated for each memory chip 2.

The peak management information stored in the ROM area includes information on a frequency division cycle for setting a clock frequency used for the control of the TDPPM, information on the total number of slots indicating the cycle in which the slot number is circulated, and information on a slot allocation number for designating a slot in which a current peak may be generated, and leader-follower information indicating a leader or a follower. In addition, the information on the slot allocation number and the leader-follower information are set for each memory chip 2.

The system information including the peak management information is read by a power-ON•read executed immediately after the memory system or the memory chip 2 is started. The memory chip 2 controls the write operation and the read operation of user data, by using the system information and the peak management information read from the ROM area by the power-ON•read.

The control circuit 27 includes a peak control circuit 27a and a ROM register 27b. The ROM register 27b stores the system information and the peak management information read by the power-ON•read. The peak control circuit 27a controls a timing when the peak of current flowing in the memory chip 2 is generated. That is, until a peak enable signal is input for permitting an execution of a partial operation in which the current peak is generated (hereinafter, referred to as a peak operation) in the operation of the memory chip 2, the peak control circuit 27a suspends the peak operation. For example, the read operation includes a channel clean operation which is one example of a peak operation. For the peak operation such as the channel clean operation or the like, the peak control circuit 27a performs a control to wait for the input of the peak enable signal to execute the peak operation (peak operation control), thereby preventing the peak current from increasing more than expected. In addition, by appropriately adjusting a timing, the peak control circuit 27a may cause the peak operation to be executed at a timing corresponding to the timing at which the peak enable signal is input.

The control circuit 27 outputs the peak management information stored in the ROM register 27b to the logic control circuit 21, which uses the peak management information to generate the peak enable signal.

(Configuration of Logic Control Circuit for Peak Operation Control)

Figure 7:
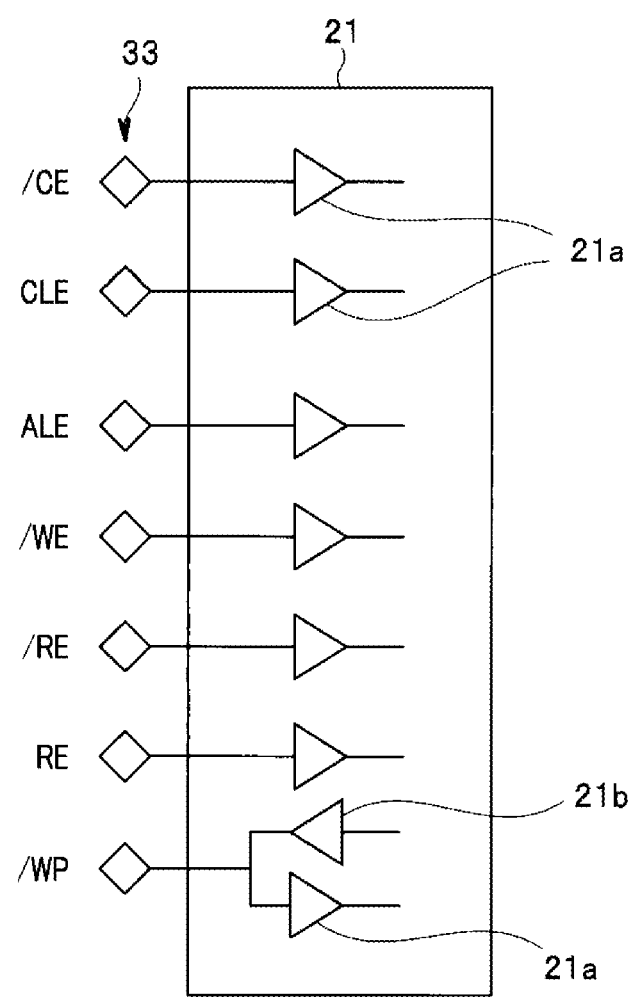
FIG. 7 is a circuit diagram illustrating a part of a configuration of a logic control circuit.

FIG. 7 is a circuit diagram illustrating a part of a configuration of the logic control circuit 21. The logic control circuit 21 includes an input receiver 21a for each terminal of the logic control pad group 33. The input receiver 21a receives a signal input via each terminal. Further, the logic control circuit 21 includes an output driver 21b corresponding to the terminal /WP of the logic control pad group 33. The input receiver 21a receives a signal input via each terminal. In addition, as described later, the input receiver 21a corresponding to the terminal /WP receives the clock CK transmitted from the terminal /WP of another memory chip 2, and the output driver 21b transmits the clock CK to be sent to another memory chip 2.

As illustrated in FIG. 5, the logic control circuit 21 includes a control unit 41, a clock (CLK) oscillator 42, a frequency divider 43, an output circuit 44, and an input circuit 45, a multiplexer 46, and a peak operation permission circuit 47, in addition to the circuit unit that controls the input/output circuit 22. In addition, the input circuit 45 corresponds to the input receiver 21a of FIG. 7, and the output circuit 44 corresponds to the output driver 21b of FIG. 7. The control unit 41 controls the entire logic control circuit 21. The control unit 41 may be configured with a processor using a CPU, an FPGA (field programmable gate array), or the like. The control unit 41 may control each unit according to a program stored in a memory (not illustrated), or may implement a part or all of the functions in a hardware electronic circuit. The control unit 41 controls each unit based on the peak management information.

The clock oscillator 42 generates a clock having a predetermined frequency, and outputs the generated clock to the frequency divider 43. The control unit 41 designates a frequency division number based on the information of the frequency division cycle in the peak management information, and the frequency divider 43 generates the clock CK by dividing the frequency of the clock output from the clock oscillator 42. The frequency divider 43 outputs the clock CK obtained by the frequency division to the output circuit 44 and the multiplexer 46. A clock generation circuit is configured with the clock oscillator 42 and the frequency divider 43.

The output circuit 44 is controlled by the control unit 41, and outputs the clock CK from the frequency divider 43 to the terminal /WP. Further, the input circuit 45 is controlled by the control unit 41, and receives the clock CK input via the terminal /WP. The input circuit 45 outputs the received clock CK to the multiplexer 46.

The multiplexer 46 is controlled by the control unit 41, selects either the clock CK from the frequency divider 43 or the clock CK received by the input circuit 45, and outputs the selected clock CK to the peak operation permission circuit 47.

In the present embodiment, the control unit 41 determines whether the memory chip is designated as a leader or a follower, based on the leader-follower information in the peak management information stored in the ROM register 27b. The control unit 41 of the memory chip designated as a leader operates the clock oscillator 42, the frequency divider 43, the output circuit 44, the multiplexer 46, and the peak operation permission circuit 47. Further, the control unit 41 of the memory chip designated as a follower operates the input circuit 45, the multiplexer 46, and the peak operation permission circuit 47.

That is, in the logic control circuit 21 of the memory chip designated as a leader, the clock CK is output to each memory chip 2 connected to the terminal /WP via the terminal /WP by the output circuit 44. Further, in the logic control circuit 21 of the memory chip designated as a follower, the input circuit 45 receives the clock CK output from another memory chip 2 via the terminal /WP. The control unit 41 of the memory chip designated as a leader causes the multiplexer 46 to select the clock CK output by the frequency divider 43 and provide the selected clock CK to the peak operation permission circuit 47, and the control unit 41 of the memory chip designated as a follower causes the multiplexer 46 to select the clock CK output by the frequency divider 43, and provide the selected clock CK to the peak operation permission circuit 47.

In the present embodiment, the peak operation permission circuit 47 which is a designation circuit is controlled by the control unit 41, to generate the peak enable signal for controlling a timing at which the peak current is generated. For example, the peak operation permission circuit 47 may be configured with a shift register. The peak operation permission circuit 47 recognizes a current slot number, by counting the clock CK input via the multiplexer 46 while resetting a count value based on the information on the total number of slots. The peak operation permission circuit 47 is given a slot allocation number from the control unit 41, and generates the peak enable signal in synchronization with a timing when the current slot number reaches the slot allocation number. The peak operation permission circuit 47 outputs the generated peak enable signal to the peak control circuit 27a.

Figure 8:
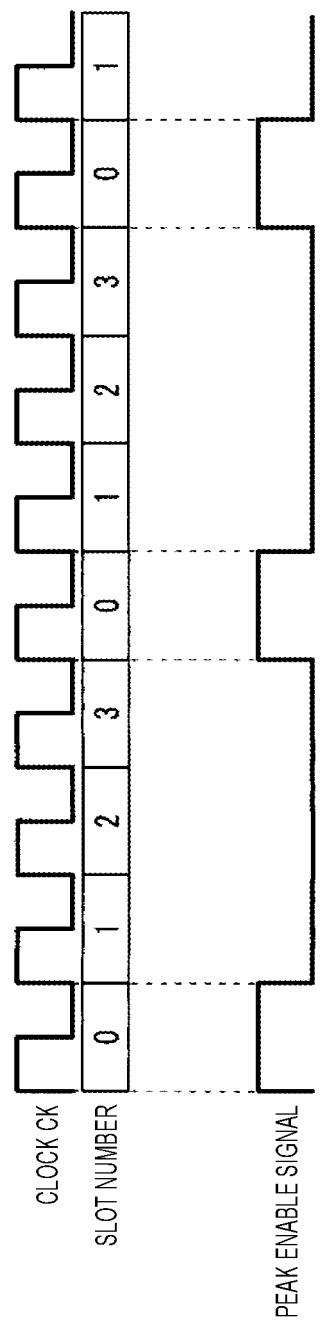
FIG. 8 is a timing diagram illustrating an example of a peak enable signal.
Figure 9:
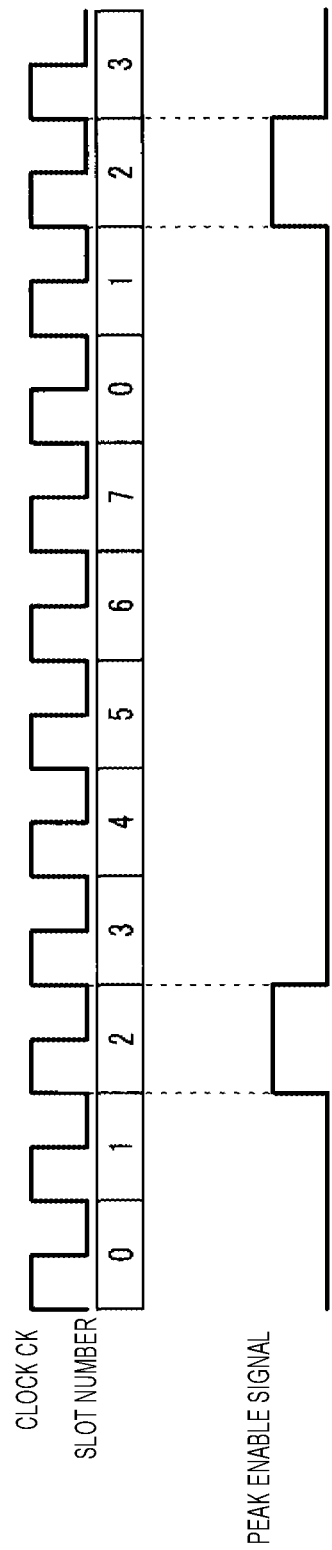
FIG. 9 is a timing diagram illustrating another example of a peak enable signal.

FIGS. 8 and 9 are views illustrating the generation of the peak enable signal.

FIG. 8 represents an example where the total number of slots is 4, and the slot allocation number set in a specific memory chip 2 is 0. Further, FIG. 9 represents an example where the total number of slots is 8, and the slot allocation number set in a specific memory chip 2 is 2.

As described above, the peak operation permission circuit 47 obtains a current slot number, by counting the clock CK while resetting a count value based on the total number of slots. That is, in the example of FIG. 8, slot numbers 0, 1, 2, 3, 0, 1, . . . are obtained. The peak operation permission circuit 47 generates the peak enable signal at a timing when the current slot number reaches the slot allocation number. In the example of FIG. 8, since the slot allocation number is 0, the peak enable signal is obtained which becomes the H level every time the count value becomes 0.

Further, in the example of FIG. 9, slot numbers 0, 1, 2, 3, 4, 5, 6, 7, 0, 1, . . . are obtained. In the example of FIG. 9, since the slot allocation number is 2, the peak enable signal is obtained which becomes the H level every time the count value becomes 2.

(Operation)

Figure 10:
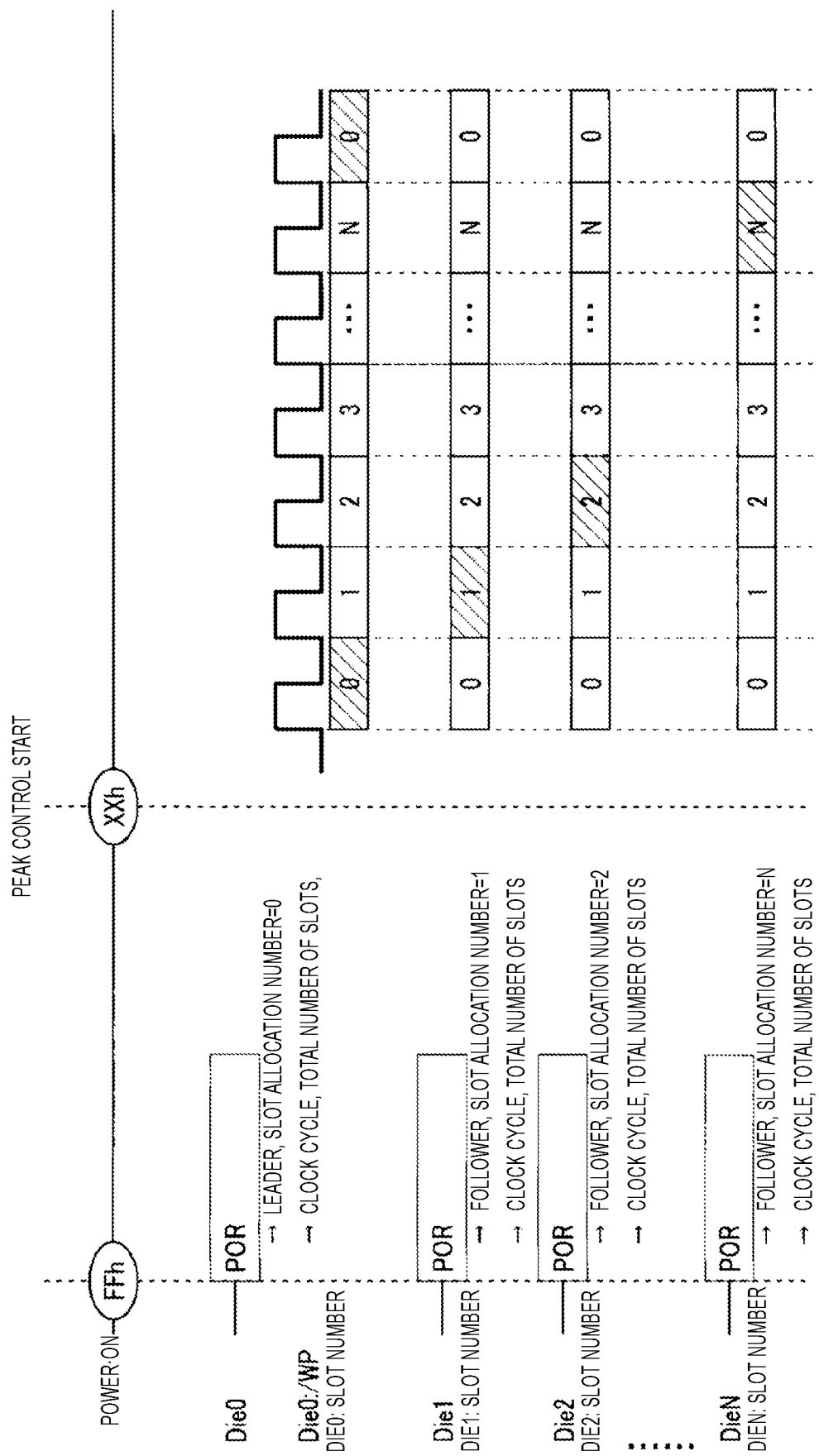
FIG. 10 is a timing diagram illustrating a peak operation control.
Figure 11:
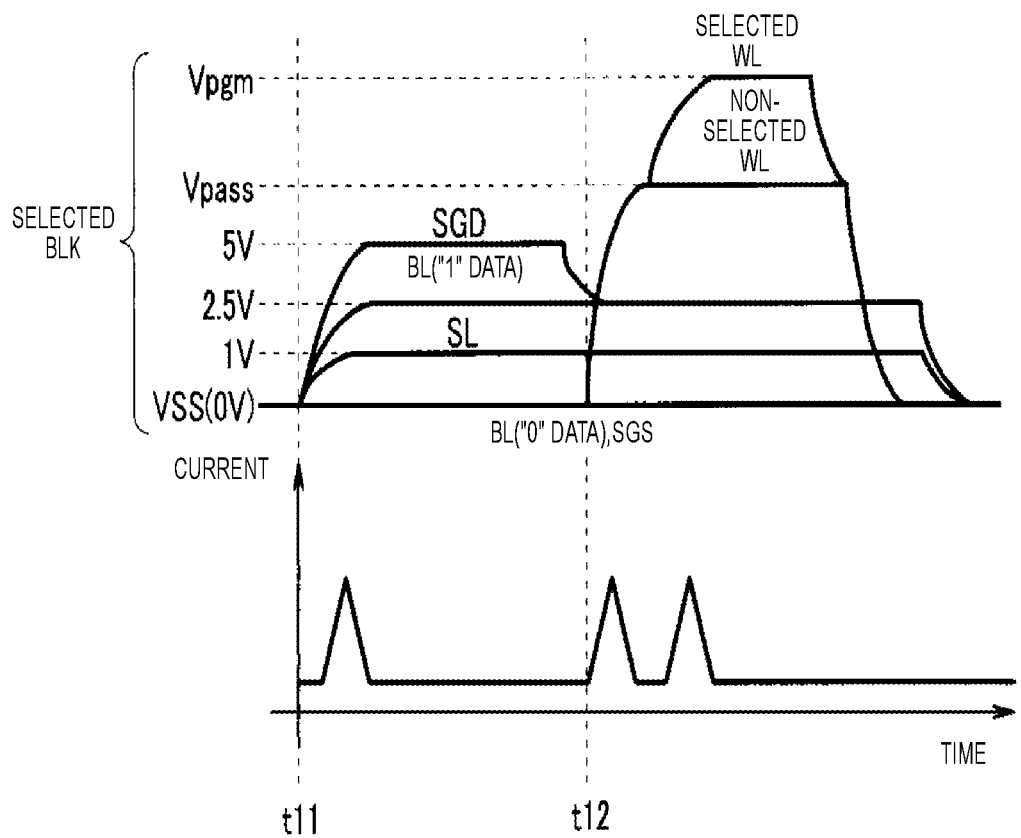
FIG. 11 is a timing diagram illustrating a current generated during a program operation.
Figure 12:
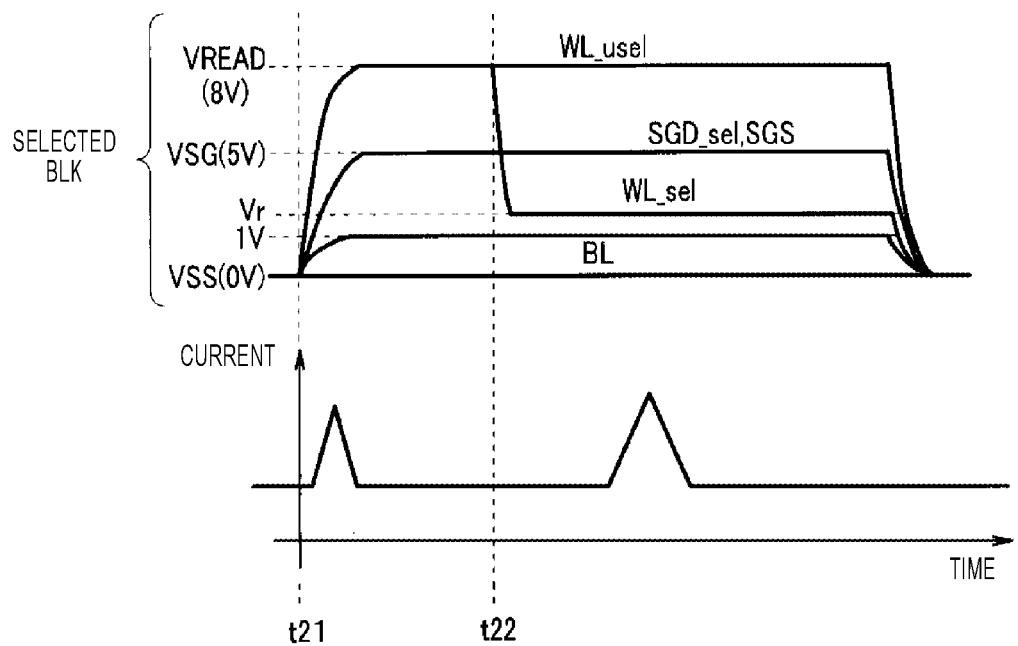
FIG. 12 is a timing diagram illustrating a current generated during a read operation.
Figure 13:
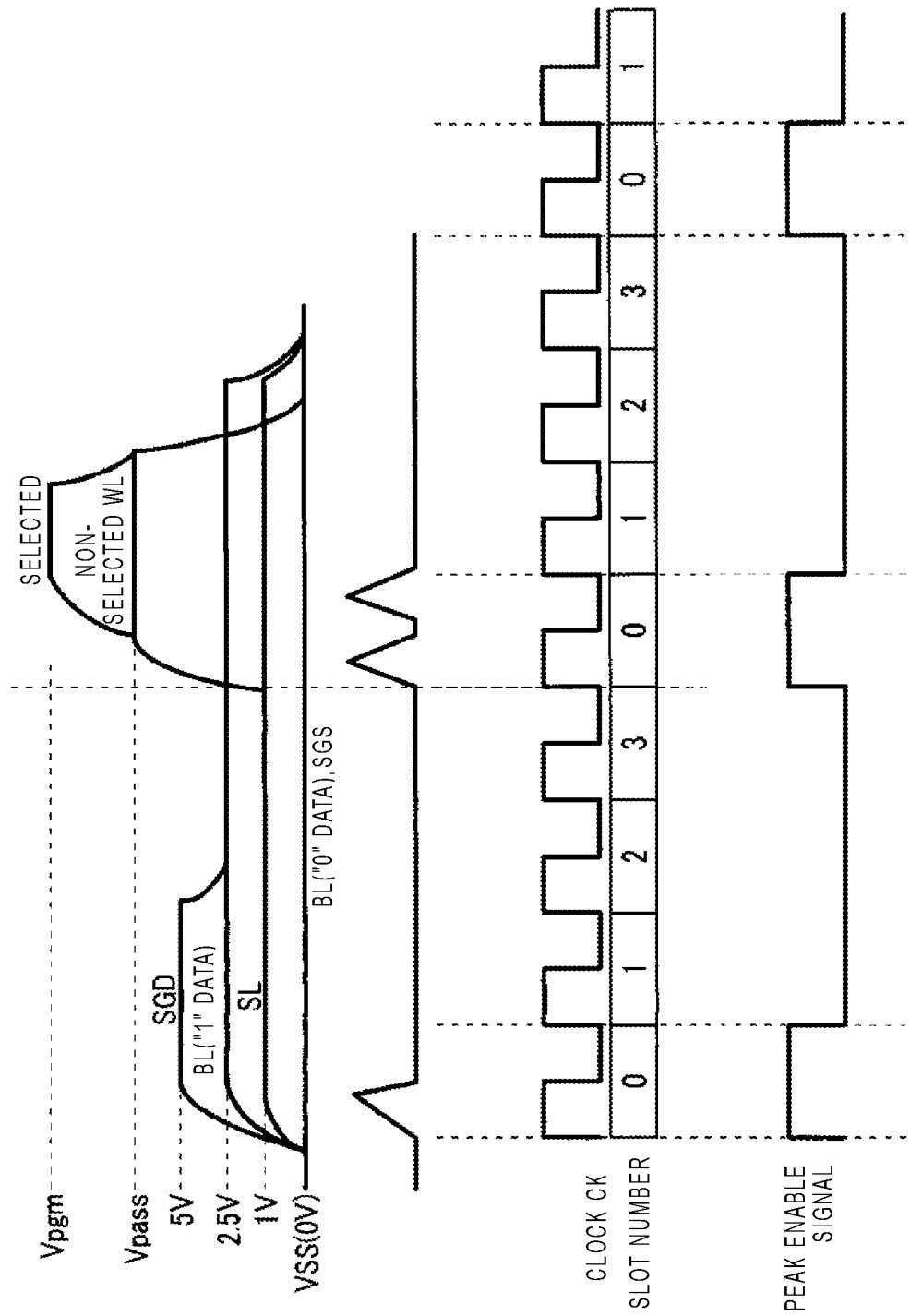
FIG. 13 is a timing diagram illustrating a peak operation control in a specific memory chip.

Next, the operation of the embodiment configured as described above will be described with reference to FIGS. 10 to 13. FIG. 10 is a view illustrating the peak operation control. FIGS. 11 and 12 are views illustrating the current generated during the peak operation, and FIG. 13 is a view illustrating the peak operation control in a specific memory chip 2.

FIG. 10 represents the period of the peak operation in relation to commands from the memory controller 1 and the peak operation control of each of the N+1 memory chips 2 (the memory chips Die0 to DieN in FIG. 10), where time is represented by the horizontal axis. In addition, in the example of FIG. 10, it is assumed that the peak management information stored in the ROM area of the memory cell array 23 includes the frequency division cycle, the total number of slots N, the slot allocation number for each of the memory chips Die0 to DieN, and information indicating that the memory chip Die0 is a leader, and the other memory chips Die1 to DieN are followers.

After the power is turned ON, each of the memory chips Die0 to DieN receives a power-ON•read command FFh transmitted from the memory controller 1. The power-ON•read command FFh is not accompanied by the chip address Cadd. That is, when the command FFh is received, each of the memory chips Die0 to DieN executes the power-ON•read operation, regardless of the chip address thereof. When the command FFh is received, each of the memory chips Die0 to DieN reads the system information and the peak management information from the ROM area of each memory cell array 23, and stores the read information in the ROM register 27b of the control circuit 27. The command which is not accompanied by the chip address Cadd, such as the power-ON•read command FFh, will also be referred to as a broadcast command. Meanwhile, a command which is accompanied by the chip address Cadd will be referred to as an individual command.

In the example of FIG. 10, the memory chip Die0 is designated as a leader, and "0" is set as the slot allocation number, by the power-ON•read (POR). Further, the memory chips Die1 to DieN are designated as followers, and allocated with 1 to N as slot allocation numbers, respectively. Further, information on the clock cycle and the total number of slots is also set in the memory chips Die0 to DieN.

The control circuit 27 of each of the memory chips Die0 to DieN waits for a reception of a peak control start command XXh transmitted from the memory controller 1. The peak control start command XXh is also not accompanied by the chip address Cadd. That is, when the command XXh is received, each of the memory chips Die0 to DieN starts the peak control, regardless of the chip address thereof. That is, in the present embodiment, each memory chip 2 starts the peak operation control by receiving the peak control start command. That is, the peak control start command XXh is a broadcast command, and is transmitted from the memory controller 1 when the peak operation control is required. In other words, when the peak operation control is not required, the execution of the peak operation control may be suspended, by suspending the transmission of the peak control start command from the memory controller 1. In addition, when the control of the start of the peak operation control by the peak control start command is unnecessary, the peak operation control may be started after a predetermined time elapses from the start of the power-ON•read. When the peak control start command is received, the control circuit 27 of each of the chips Die0 to DieN sends the peak management information to the control unit 41 of the logic control circuit 21, to start the peak operation control.

The control unit 41 of the memory chip Die0 designated as a leader operates the clock oscillator 42, the frequency divider 43, the output circuit 44, the multiplexer 46, and the peak operation permission circuit 47. The clock oscillator 42 generates a clock, and the frequency divider 43 divides the frequency of the oscillation clock of the clock oscillator 42 by the frequency division number designated according to the frequency division cycle, and outputs the clock CK. As illustrated in FIG. 10, the output circuit 44 outputs the clock CK via the terminal /WP. The terminals /WP of the memory chips Die0 to DieN are connected to each other, and the clock CK from the memory chip Die0 which is a leader is supplied to the terminals /WP of the memory chips Die1 to DieN which are followers. The multiplexer 46 of the memory chip Die0 which is a leader outputs the clock CK from the frequency divider 43 to the peak operation permission circuit 47.

The control unit 41 of each of the memory chips Die1 to DieN designated as followers operates the input circuit 45, the multiplexer 46, and the peak operation permission circuit 47. In each of the memory chips Die1 to DieN, the input circuit 45 receives the clock CK input via the terminal /WP, and sends the received clock CK to the multiplexer 46. The multiplexers 46 of the memory chips Die1 to DieN output the clock CK received by the input circuit 45 to the peak operation permission circuit 47.

In this way, the common clock CK is input to the peak operation permission circuit 47 of each of the memory chips Die0 to DieN. The peak operation permission circuit 47 counts the clock CK while resetting the count value based on the total number of slots. As a result, as illustrated in FIG. 10, slots 0 to N are set in synchronization with the clock CK. The peak operation permission circuit 47 generates the peak enable signal when the slot number matches the slot allocation number.

The shaded portion in FIG. 10 indicates a period when the peak enable signal becomes active, and the peak operation permission circuit 47 of each of the memory chips Die0 to DieN generates the peak enable signal at a timing corresponding to each of the slots indicated by the slot numbers 0, 1, 2, . . . N, and sends the generated peak enable signal to the peak control circuit 27a. In this way, the peak control circuit 27a of each of the memory chips Die0 to DieN performs the peak operation control for generating the peak current during the slot period corresponding to the allocated slot allocation number.

FIGS. 11 and 12 represent an example of a voltage change of various wires of the memory cell array 23. FIG. 11 represents the generation of peak current caused as a result of a voltage change during a program operation, and FIG. 12 represents the generation of peak current caused as a result of a voltage change during the read operation.

Wires such as word lines WL, bit lines BL, select gate lines SGD and SGS and others are provided in the memory cell array 23, and FIG. 11 represents voltage changes of the wires during the program operation. That is, for a block BLK in which a write is to be executed (selected block BLK), a channel precharge period is set to timings t11 to t12 before the application of a program voltage Vpgm, and the select gate line SGD is set to, for example, 5 V during the period. After the end of the channel precharge period, a relatively high voltage Vpass is applied to non-selected word lines (non-selected WL), and further, the high voltage Vpgm is applied to a word line to which a write is to be executed (selected WL). In this program operation, current peaks are generated corresponding to the time when the channel precharge period is started, the time when the application of the voltage Vpass is started, the time when the application of the voltage Vpgm is started, and others.

As illustrated in FIG. 12, during the read operation (verify operation), a disturb prevention period (USTRDIS period) is set to timings t21 to t22, and during the period after t22, a read voltage Vr is applied to the selected word line WL (hereinafter, also referred to as WL_sel) of the selected block. A read period is set to a period after the end of the disturb prevention period (after the timing t22), and a voltage VSG (e.g., 5 V) is applied to the select gate line SGD_sel, SGD_use1, and SGS of the selected block during the read period. Further, at the start of the disturb prevention period, a sufficiently high voltage VREAD (e.g., 8 V) is applied to each of the selected word line WL_sel of the selected block and the non-selected word line WL_use1 of the selected block. In the read operation, current peaks are generated corresponding to the time when the disturb prevention period is started, the time when the application of the voltage VREAD is started, and some interim timing (for example, sense timing) of the read period.

In the present embodiment, the peak operation in which the current peak is generated is performed in the slot of the slot allocation number allocated to each of the memory chips Die0 to DieN. FIG. 13 represents a period in which the peak operation is performed, during the program operation performed in a specific memory chip 2. In the example of FIG. 13, in the specific memory chip 2, the peak operation is performed in the slot of the slot number 0.

FIG. 13 represents an example of the memory chip 2 with "0" allocated as the slot allocation number. The peak control circuit 27a of the memory chip 2 starts a channel precharge during the period of the slot number "0". As a result, the current peak is generated during the period of the slot number "0". The memory chip 2 does not perform the peak operation until the slot number becomes "0" again. Thus, for example, even when the channel precharge period ends during the slot period of the slot number 2, the program operation is suspended until the slot of the slot number "0" comes around again. When the slot of the slot number 0 comes around, the program operation in which the peak operation is performed is restarted.

Since the respective memory chips 2 execute their peak operations in different slots, and the timings of the current peak in the respective memory chips 2 are deviated from each other, the peak current in the entire memory system may be reduced.

According to the present embodiment described above, in the semiconductor memory device having the multi-chip configuration, a specific chip is designated as a leader, and the other chips are designated as followers, such that the peak operation control of each chip is performed in the manner that all of the chips use a clock generated by the leader, thereby reducing the peak current. Further, the memory cell array stores, in advance, the peak management information for the peak operation control, so that the peak management information does not need to be supplied from the memory controller 1 to the memory chip 2. Further, the peak operation control may be started by the peak control start command, and the peak operation control may be performed when the peak operation control is required.

While descriptions have been made on an example where the terminals /WP of the respective memory chips 2 are connected in common to each other to transmit the clock CK for the peak operation control, another terminal of each memory chip 2 may be used to transmit the clock CK. For example, the clock CK may be transmitted by using the terminal for transmitting the signal R/B.

Second Embodiment

Figure 14:
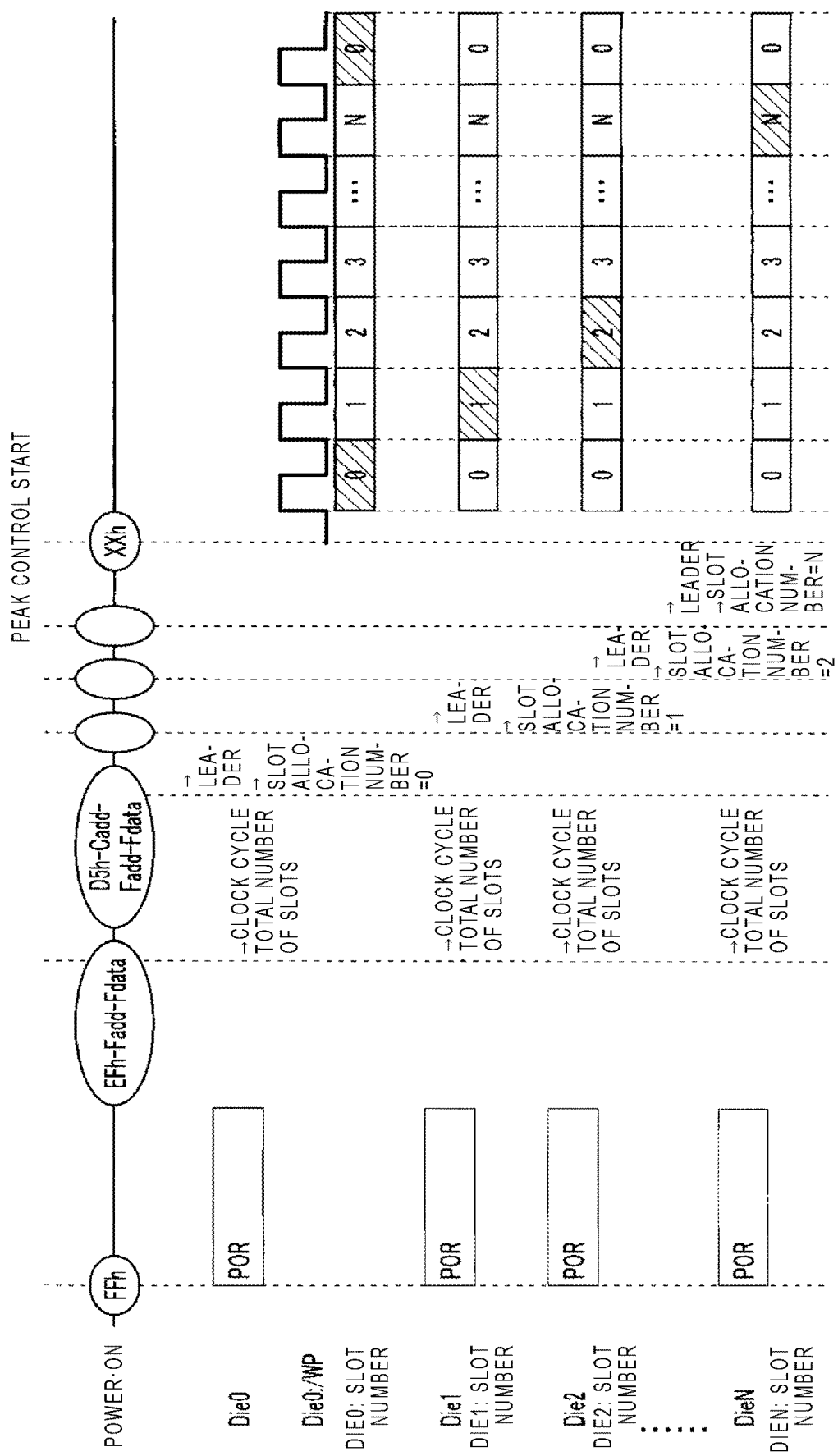
FIG. 14 is a timing diagram illustrating another embodiment of the present disclosure.
Figure 15:
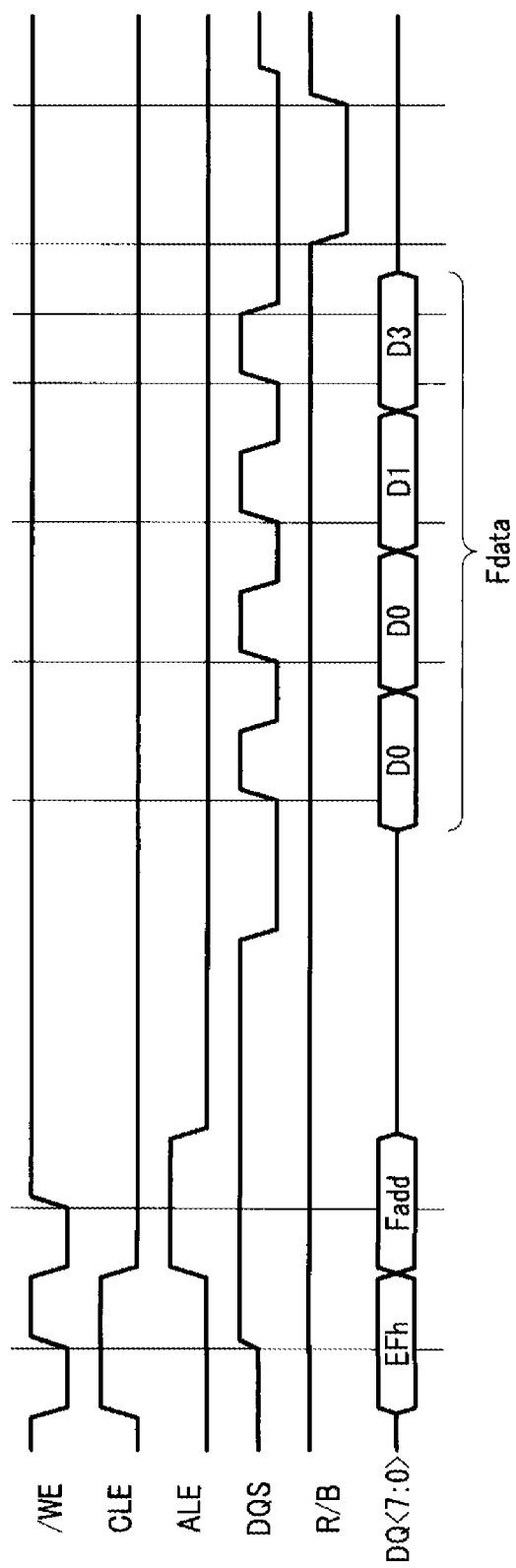
FIG. 15 is a timing diagram illustrating a command sequence intended for all memory chips.
Figure 16:
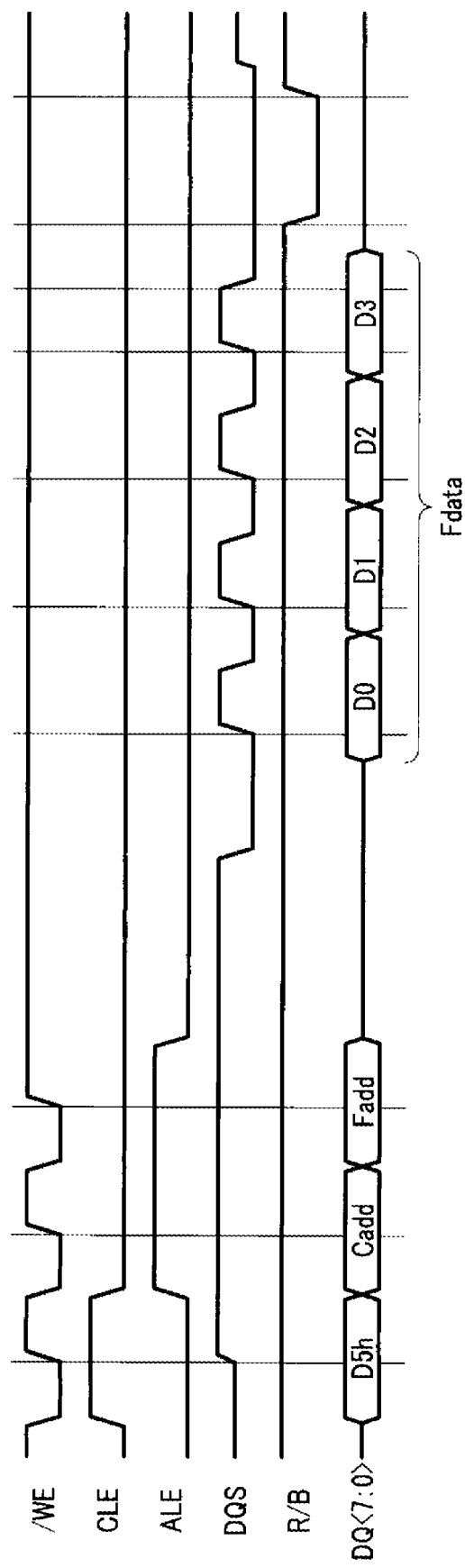
FIG. 16 is a timing diagram illustrating a command sequence intended for a particular memory chip.

FIG. 14 is a view illustrating another embodiment of the present disclosure. The hardware configuration of the present embodiment is the same as that of the first embodiment. FIGS. 15 and 16 are timing charts illustrating a SetFeature sequence. FIG. 15 represents the entire SetFeature sequence, and FIG. 16 represents an individual SetFeature sequence.

In the first embodiment, an example where the peak management information is stored in the memory cell array 23 in advance has been described. However, in the present embodiment, the peak management information is set in each memory chip 2 in response to a command from the memory controller 1. FIG. 14 represents the period of the peak operation in relation to commands from the memory controller 1 and the peak operation control of each of the N+1 memory chips 2 (the memory chips Die0 to DieN in FIG. 14), where time is represented by the horizontal axis.

After the power is turned ON, the processor 12 of the memory controller 1 transmits the command FFh for the power-ON•read to all of the memory chips Die0 to DieN. When the command FFh is received, each of the memory chips Die0 to DieN reads the system information from the ROM area of its memory cell array 23, and stores the read system information in the ROM register 27b of the control circuit 27. In this step, the peak management information is not stored in the ROM registers 27b of each of the memory chips Die0 to DieN. Then, the processor 12 of the memory controller 1 generates a SetFeature command EFh for all of the memory chips Die0 to DieN, and transmits common peak management information to all of the memory chips Die0 to DieN. Since the SetFeature command EFh is not accompanied by the chip address Cadd, the command is a broadcast command.

FIG. 15 represents the SetFeature sequence in this case. At the time of starting the SetFeature sequence, the processor 12 of the memory controller 1 makes the signal CLE active to generate the SetFeature command EFh, and makes the signal /WE active to input the SetFeature command EFh to the memory chips Die0 to DieN. Then, the processor 12 makes the signal ALE active to generate a feature address Fadd, and input the feature address Fadd to the memory chips Die0 to DieN.

Then, the processor 12 makes the signal DQS active a plurality of times, to transmit SetFeature data D0 to D3

(feature data Fdata). As a result, the SetFeature data D0 to D3 are input to the memory chips Die0 to DieN. By the SetFeature data D0 to D3, the information on the clock cycle and the total number of slots among the peak management information is transmitted to the memory chips Die0 to DieN, and stored in the ROM register 27b.

Then, the processor 12 of the memory controller 1 transmits additional peak management information individually to each of the memory chips Die0 to DieN. In this case, the processor 12 sequentially transmits the peak management information to each of the memory chips Die0 to DieN according to the sequence of FIG. 16. The additional peak management information transmitted in this case is leader-follower information and information of a slot allocation number. The processor 12 generates an individual SetFeature command D5h to make the signal /WE active. Further, the processor 12 makes the signal ALE active, to continuously generate the chip address Cadd and the feature address Fadd. Then, the processor 12 makes the signal DQS active a plurality of times, to transmit the leader-follower information and the information of a slot allocation number as the SetFeature data D0 to D3 (feature data Fdata). Since the SetFeature command D5h is accompanied by the chip address Cadd, the command is an individual command.

In the example of FIG. 14, information indicating a leader and information indicating that the slot allocation number is "0" are transmitted to the memory chip Die0. The control circuit 27 of the memory chip Die0 stores the received peak management information in the ROM register 27b. Then, the memory chips Die1, Die2, . . . , DieN sequentially receive the leader-follower information and the information of the slot allocation number. In addition, the memory chips Die1, Die2, . . . , DieN are given information indicating followers and information indicating that the slot allocation numbers are 1, 2, . . . , N, respectively. The control circuit 27 of each of the memory chips Die1, Die2, . . . , DieN stores the received follower information and the slot allocation number in the ROM register 27b. In this way, all the peak management information is stored in the ROM registers 27b of the memory chips Die0 to DieN.

FIG. 14 represents D5h-Cadd-Fadd-Fdata as the SetFeature sequence, but omits the SetFeature sequences for the memory chips Die1 to DieN for simplicity. Further, followers and slot allocation numbers may be set for all of the memory chips Die0 to DieN through an initial setting. In this case, the leader information may be given to one of the memory chips Die0 to DieN, and the individual SetFeature sequence may be performed one at a time.

The processor 12 of the memory controller 1 transmits the peak control start command XXh. When the peak control start command XXh transmitted from the memory controller 1 is received, the control circuit 27 of each of the memory chips Die0 to DieN sends the peak management information to the control unit 41 of the logic control circuit 21, to start the peak operation control.

In a configuration where the memory system includes 16 memory chips, the memory controller 1 needs to output necessary commands for these 16 memory chips. More specifically, the memory controller 1 outputs the following commands:

Power-ON•read (broadcast command) FFh×1
SetFeature (broadcast command)—frequency division cycle×1
SetFeature (broadcast command)—total number of slots×1
SetFeature (individual command)—slot allocation number×16
SetFeature (individual command)—leader information×1
SetFeature (individual command)—follower information×15
Peak control start (broadcast command)—×1

The other operations are the same as those in FIG. 10.

In the embodiment configured as described above, the same effects as those of the first embodiment may be obtained. Further, since the peak management information may be set by a command from the memory controller, the degree of freedom of the peak operation control may be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a first pad;
a clock generation circuit configured to generate a first clock, wherein the clock generation circuit includes an oscillator, and a frequency divider configured to divide a frequency of an output of the oscillator to generate the first clock;
a memory that stores first information indicating a total number of time slots, second information indicating which of the time slots should be designated as a designated time slot, and third information designating the semiconductor memory device as either a leader or a follower;
an output circuit configured to output the first clock through the first pad;
a designation circuit configured to count clock cycles of the first clock and designate one of the time slots as the designated time slot based on a count of the clock cycles, the first information, and the second information; and
a peak control circuit configured to execute an operation that generates a current peak, at a timing corresponding to the designated time slot, wherein
the output circuit is operational when the semiconductor memory device is designated as the leader, and is not operational when the semiconductor memory device is designated as the follower.

2. The semiconductor memory device according to claim 1, wherein each time slot corresponds to one clock cycle of the first clock in each of a plurality of groups of contiguous clock cycles of the first clock, that are contiguous with one another.

3. The semiconductor memory device according to claim 1, wherein the clock generation circuit, the output circuit, the designation circuit, and the peak control circuit operate in response to a peak control start command.

4. The semiconductor memory device according to claim 1, wherein
the designation circuit is configured to output a peak enable signal at the timing corresponding to the designated time slot to the peak control circuit, and
the peak control circuit is configured to execute the operation in response to the receipt of the peak enable signal from the designation circuit.

5. The semiconductor memory device according to claim 1, wherein the first, second, and third information are retrieved from a read-only-memory area of the semiconductor memory device.

6. The semiconductor memory device according to claim 1, wherein the first, second, and third information are received through additional pads of the semiconductor memory device from a memory controller connectable to the semiconductor memory device.

7. The semiconductor memory device according to claim 6, wherein
the first information is received with a command that does not include a chip address, and
the second and third information are received with a command that includes a chip address.

8. A memory system comprising:
a plurality of semiconductor memory devices, each including
a first pad,
a clock generation circuit configured to generate a first clock,
an output circuit configured to output the first clock through the first pad,
a designation circuit configured to designate one of a plurality of contiguous time slots, each of which is set with respect to clock cycles of the first clock, and
a peak control circuit configured to execute an operation that generates a current peak, at a timing corresponding to the designated time slot; and
a memory controller configured to control the plurality of semiconductor memory devices.

9. The memory system according to claim 8, wherein the output circuit of one of the plurality of semiconductor memory devices is operational and the output circuit of each of the other semiconductor memory devices is not operational.

10. The memory system according to claim 9, wherein the first pad of each of the plurality of semiconductor memory devices is electrically connected together through bonding wires.

11. The memory system according to claim 10, wherein the clock generation circuit in each of the semiconductor memory devices includes an oscillator, and a frequency divider configured to divide a frequency of an output of the oscillator to generate the first clock, and
the first clock is shared among the plurality of semiconductor memory devices through the first pads of the plurality of semiconductor memory devices.

12. The memory system according to claim 11, wherein
one of the plurality of semiconductor memory devices supplies the first clock generated by the clock generation circuit thereof to the designation circuit therein, and
each of the other semiconductor memory devices receives the first clock through the first pad thereof and supplies the received first clock to the designation circuit therein.

13. The memory system according to claim 12, wherein the memory controller issues a command to said one of the plurality of semiconductor memory devices to be a leader, and issues a command to said each of the other semiconductor memory devices to be a follower.

14. The memory system according to claim 12, wherein
each of the plurality of semiconductor memory devices includes a read-only-memory that stores information designating the semiconductor memory device to be a leader or a follower, and
said one of the plurality of semiconductor memory devices is designated as the leader in the information stored in the read-only-memory thereof, and said each of the other semiconductor memory devices is designated as the follower in the information stored in the read-only-memory thereof.

15. The memory system according to claim 8, wherein each time slot corresponds to one clock cycle of the first clock in each of a plurality of groups of contiguous clock cycles of the first clock, that are contiguous with one another.

16. The memory system according to claim 8, wherein
a total number of the plurality of contiguous time slots is equal to a total number of the plurality of semiconductor memory devices, and
the designated time slots of the plurality of semiconductor memory devices are different.

17. The memory system according to claim 10, wherein the first pad is a write protection signal control pad.

* * * * *